United States Patent
Fahs et al.

(10) Patent No.: US 12,167,184 B2
(45) Date of Patent: Dec. 10, 2024

(54) CROSS-CONNECT SWITCH ARCHITECTURE

(71) Applicant: RENSSELAER POLYTECHNIC INSTITUTE, Troy, NY (US)

(72) Inventors: Bassem Fahs, Troy, NY (US); Robert F. Karlicek, Jr., Mechanicville, NY (US); Mona Mostafa Hella, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 942 days.

(21) Appl. No.: 17/043,795

(22) PCT Filed: Apr. 2, 2019

(86) PCT No.: PCT/US2019/025327
§ 371 (c)(1),
(2) Date: Sep. 30, 2020

(87) PCT Pub. No.: WO2019/195244
PCT Pub. Date: Oct. 10, 2019

(65) Prior Publication Data
US 2021/0021916 A1    Jan. 21, 2021

Related U.S. Application Data

(60) Provisional application No. 62/651,301, filed on Apr. 2, 2018.

(51) Int. Cl.
*H03F 3/08* (2006.01)
*H04Q 11/00* (2006.01)

(52) U.S. Cl.
CPC ......... *H04Q 11/0005* (2013.01); *H03F 3/085* (2013.01); *H04Q 11/0062* (2013.01); *H04Q 2011/0016* (2013.01); *H04Q 2011/0024* (2013.01); *H04Q 2011/0026* (2013.01)

(58) Field of Classification Search
None
See application file for complete search history.

(56) References Cited

U.S. PATENT DOCUMENTS

| 4,950,882 | A  | 8/1990  | Goutzoulis et al. |
| 5,010,588 | A  | 4/1991  | Gimlett |
| 5,995,256 | A  | 11/1999 | Fee |
| 6,759,641 | B1 | 7/2004  | Loose |

(Continued)

OTHER PUBLICATIONS

International Search Report and The Written Opinion of the International Searching Authority, International Application No. PCT/US2019/025327, mailed Jul. 1, 2019.

(Continued)

*Primary Examiner* — Chad H Smith
(74) *Attorney, Agent, or Firm* — Barclay Damon LLC; Anthony P. Gangemi

(57) ABSTRACT

A cross-connect switch architecture is described. A cross-connect switch device includes a cross-point switch array, a plurality of photo detectors and a plurality of amplifiers. The cross-point switch array includes a plurality of switches. Each switch is coupled between a respective photo detector and a respective amplifier and is configured to couple the respective photo detector to the respective amplifier when the switch is selected.

14 Claims, 4 Drawing Sheets

(56) References Cited

U.S. PATENT DOCUMENTS

| | | |
|---|---|---|
| 9,451,341 B2 | 9/2016 | Svilans |
| 2002/0180490 A1 | 12/2002 | Voorman et al. |
| 2008/0291309 A1 | 11/2008 | Gruev et al. |
| 2012/0207247 A1 | 8/2012 | Cheng |
| 2012/0298877 A1 | 11/2012 | Dinapoli et al. |
| 2015/0207469 A1 | 7/2015 | Mita et al. |
| 2015/0372781 A1 | 12/2015 | Frankel et al. |
| 2016/0359567 A1 | 12/2016 | Kakande |
| 2018/0341031 A1* | 11/2018 | Tredwell ........... H01L 27/14612 |
| 2021/0207993 A1* | 7/2021 | Shi ....................... G01J 1/4228 |

OTHER PUBLICATIONS

Moloney, A., et al., "A High Sensitivity CMOS Photoreceiver Incorporating a High Multiplication Gain Avalanche Photodiode," Department of Electrical and Electronic Engineering, University College Cork, 2004.

Sangirov, J., et al., "Design of Small-area Transimpedance Optical Receiver Module for Optical Interconnects," Photonic Computer Systems Laboratory, Electircal Engineering Department, KAIST, 2013.

Ibrahim, S., et al., "Hybrid Optoelectronic Router for Future Optical Packet-Switched Networks," Intech, 2017.

* cited by examiner

CROSS-CONNECT SWITCH ARCHITECTURE

CROSS REFERENCE TO RELATED APPLICATION(S)

This application claims the benefit of U.S. Provisional Application No. 62/651,301, filed Apr. 2, 2018, and which is incorporated by reference as if disclosed herein in its entirety.

GOVERNMENT LICENSE RIGHTS

This invention was made with government support under award number EEC0812056 awarded by the National Science Foundation (NSF), Division of Engineering Education and Centers (EEC), and award number C090145 awarded by NYSTAR of the Empire State Development (ESD) organization of New York State. The government has certain rights in the invention.

FIELD

The present disclosure relates to a switch architecture, in particular, to a cross-connect switch architecture.

BACKGROUND

Data centers in the United States consume a significant amount of energy, estimated at 70 billion kilowatt hours (kWh) or about 1.8% of total U.S. electricity consumption in 2014. Energy consumption is a significant concern for data centers due to, for example, global internet capacity growth, deployment of Internet of Things (IoT) as well as anticipated 5G technologies. Energy consumption may be reduced by heating, ventilation and air conditioning (HVAC) techniques but is limited by intrinsic router heating effects and expansion of data center platforms.

SUMMARY

In some embodiments, a cross-connect switch device is provided. The cross-connect switch device includes a cross-point switch array; a plurality of photo detectors; and a plurality of amplifiers. Each cross-point switch array includes a plurality of switches. Each switch is coupled between a respective photo detector and a respective amplifier and is configured to couple the respective photo detector to the respective amplifier when the switch is selected.

In some embodiments of the cross-connect switch device, the photo detectors are avalanche photo diodes and the switches are metal oxide semiconductor (MOS) transistors. In some embodiments of the cross-connect switch device, a photo diode inductance at least partially impedance matches a parasitic capacitance of a MOS transistor coupled to the photo diode.

In some embodiments of the cross-connect switch device, each photo diode is coupled to a bias voltage supply via a respective degeneration resistance. In some embodiments of the cross-connect switch device, the amplifiers are transimpedance amplifiers. In some embodiments of the cross-connect switch device, each amplifier is at least one of included in and/or coupled to a respective receiver configured to receive an electrical representation of an input optical signal.

In some embodiments of the cross-connect switch device, each switch is coupled between a column conductor and a row conductor, the column conductor coupled to a photo detector and the row conductor coupled to an amplifier. In some embodiments of the cross-connect switch device, the cross-point switch array, the photo detectors and the amplifiers are included in an integrated circuit.

In some embodiments, an optical system is provided. The optical system includes an optical interface configured to receive an optical signal; and a cross-connect switch device. The cross-connect switch device includes a cross-point switch array, a plurality of photo detectors, and a plurality of amplifiers. Each cross-point switch array includes a plurality of switches. Each switch is coupled between a respective photo detector and a respective amplifier and is configured to couple the respective photo detector to the respective amplifier when the switch is selected.

In some embodiments of the optical system, the photo detectors are avalanche photo diodes and the switches are metal oxide semiconductor (MOS) transistors. In some embodiments of the optical system, a photo diode inductance at least partially impedance matches a parasitic capacitance of a MOS transistor coupled to the photo diode. In some embodiments of the optical system, each photo diode is coupled to a bias voltage supply via a respective degeneration resistance.

In some embodiments of the optical system, the amplifiers are transimpedance amplifiers. In some embodiments of the optical system, each amplifier is at least one of included in and/or coupled to a respective receiver configured to receive an electrical representation of an input optical signal. In some embodiments of the optical system, each switch is coupled between a column conductor and a row conductor, the column conductor coupled to a photo detector and the row conductor coupled to an amplifier.

In some embodiments of the optical system, the cross-point switch array, the photo detectors and the amplifiers are included in an integrated circuit. In some embodiments of the optical system, the optical interface is an imaging optical interface comprising one optical element. In some embodiments of the optical system, the optical interface comprises a plurality of optical elements.

In some embodiments, an optical system is provided. The optical system includes a plurality of cross-connect switch devices; and an optical cross-connect configured to couple an input cross-connect switch device to one or more output cross-connect switch devices. Each cross-connect switch device includes a cross-point switch array, a plurality of photo detectors, and a plurality of laser diode drivers. Each cross-point switch array includes a plurality of switches. Each switch is coupled between a respective photo detector and a respective amplifier.

In some embodiments, the optical system may further include a plurality of laser diode output subsystems. Each laser diode subsystem includes a laser diode coupled to an output optical fiber.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DETAILED DESCRIPTION

Figure 1:
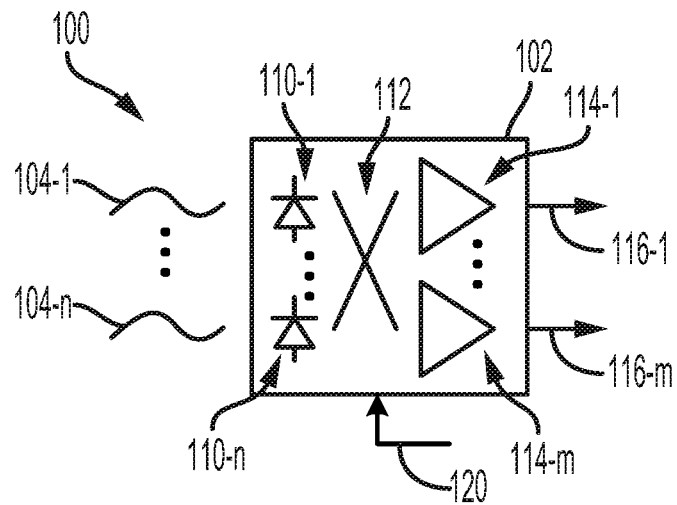
FIG. 1 illustrates a cross-connect switch system including a cross-connect switch device consistent with several embodiments of the present disclosure.

Generally, data centers contain numerous computing systems, storage devices and telecommunications systems that may be interconnected by, among other things, cross-connects. Cross-connects may be configured to connect one network or circuit to another network or circuit. Such connections may be selectable and thus switchable. A cross-connect switch device may thus be configured to selectively couple a first input to a selected output of a plurality of outputs. In one nonlimiting example, the input may be a fiber optic cable configured to carry an optical (i.e., light) signal and the output may be coupled to an amplifier and/or receiver. In another nonlimiting example, the input may be an electromagnetic wave and the output may be coupled to an amplifier and/or a receiver. A data center may contain numerous cross-connect switch devices that may thus contribute to power consumption, cost and space requirements of the data center.

Generally, the present disclosure relates to a cross-connect switch architecture. A cross-connect switch architecture includes a cross-point switch array that includes a plurality of switches. The switches may be considered normally open. In one embodiment, each switch is coupled between a photo detector of a plurality of photo detectors and an amplifier of a plurality of amplifiers. Each amplifier may be coupled to and/or included in a respective receiver. Each receiver may be configured to receive an electrical representation of an input optical signal. Each photo detector is configured to capture optical energy, e.g., a light signal, and to provide a corresponding electrical energy as output. In operation, a target photo detector may be coupled to a target amplifier by selecting (e.g., activating so as to close) the switch coupled between the target photo detector and the target amplifier. In one nonlimiting example, the switch may be a metal oxide semiconductor (MOS) transistor, the photo detector may be an avalanche photo diode and the amplifier may be a transimpedance amplifier (TIA). The MOS transistor may be impedance matched to avalanche photo diode, as will be described in more detail below.

In another embodiment, each switch is coupled between an antenna subsystem of a plurality of antenna subsystems and an amplifier of a plurality of amplifiers. Each amplifier may be coupled to and/or included in a respective receiver. Each antenna subsystem includes an antenna and may include a matching network. In one non-limiting example, the antenna may be configured to capture millimeter (mm) electromagnetic waves. In another non-limiting example, the antenna may be configured to capture electromagnetic waves with a frequency in a terahertz (THz) range. The switch may be a MOS transistor, however, this disclosure is not limited in this regard. The matching network may be configured to provide impedance matching between the antenna and the MOS transistor.

A cross-connect switch architecture consistent with the present disclosure is configured to be relatively low power with relatively low signal losses while providing relatively fast channel-to-channel switching and a reduced form factor. For example, a passive MOS switch array positioned between a photo detector array and an amplifier-receiver array may provide a relatively compact switch architecture with minimized buffering needs and lower interconnect parasitic losses, resulting in a lower DC power consumption and higher bandwidth (BW) per channel. Thus, a cross-connect switch architecture consistent with the present disclosure may be configured to provide benefits associated with both optical switching (e.g., low power consumption and low signal losses) and electrical switching (small form factor (integrated circuit) and relatively fast channel-to-channel switching).

FIG. 1 illustrates a cross-connect switch system 100 including a cross-connect switch device 102 consistent with several embodiments of the present disclosure. The cross-connect switch system 100 further includes a plurality of optical fibers 104-1, . . . , 104-n. Each optical fiber is configured to carry a respective input optical signal to cross-connect switch device 102. Cross-connect switch device 102 includes a plurality of photo detectors 110-1, . . . , 110-n, a cross-point switch array 112 and a plurality of amplifiers 114-1, . . . , 114-m. In one nonlimiting example, each amplifier may be coupled to and/or included in a respective receiver. The cross-point switch array 112 is positioned between the plurality of photo detectors and the plurality of amplifiers. Cross-connect switch device 102 is configured to provide as output a plurality of output signals 116-1, . . . , 116-m. The number of photo detectors may or may not equal the number of amplifiers.

The photo detectors may include, but are not limited to, photodiodes, photo transistors, etc. In one nonlimiting example, each of the plurality of photo detectors 110-1, . . . , 110-n, may be an avalanche photodiode. The switches may include, but are not limited to, transistors, semiconductor switches, etc. In one nonlimiting example, the switch array 112 may include MOS transistors. In one nonlimiting example, the plurality of amplifiers 114-1, . . . , 114-m, may be transimpedance amplifiers.

In operation, switch array 112 may be configured to couple a target photo detector, e.g., photo detector 110-1, to a target amplifier, e.g., amplifier 116-m, in response to control signal 120. For example, the control signal 120 may be received from a data center management system (not shown). The control signal may be configured to activate a selected switch in switch array 112. The selected switch may be coupled to the target photo detector and target amplifier. An input/output (I/O) path may then include the target photo detector followed by the selected switch then followed by the target amplifier. A cross-point switch array included in a cross-connect switch architecture that includes P photo detectors and Q amplifiers may then include P×Q switches and may have P×Q possible I/O paths. Each photo detector and each amplifier may belong to at least one possible I/O path.

Figure 2:
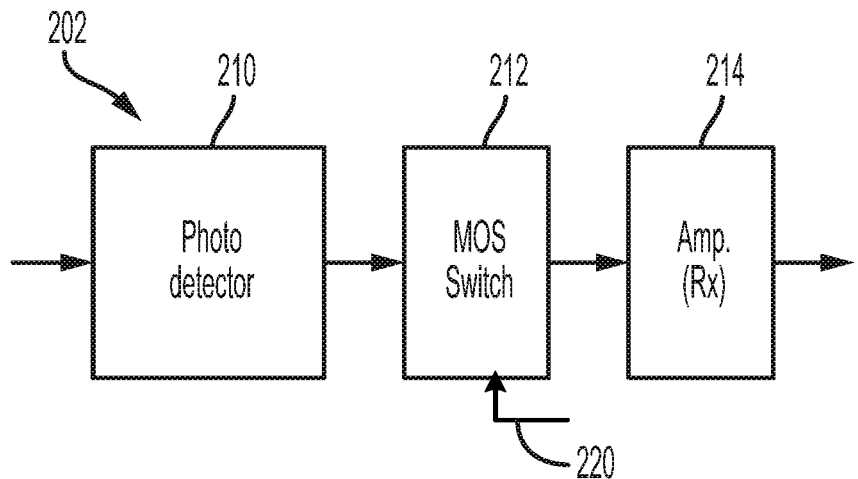
FIG. 2 illustrates a functional block diagram of one cross-point input/output path of the cross-connect switch device of FIG. 1.

FIG. 2 illustrates a functional block diagram 202 of one cross-point path of the cross-connect switch device 102 of FIG. 1. Cross-point path 202 is one example of an input/output path of cross-connect switch device 102. In this example, cross-connect switch device 102 corresponds to an opto-electrical cross-connect switch device. Cross-point path 202 includes a photo detector 210, a MOS switch 212 and an amplifier 214. For example, photo detector 210 may correspond to photo detector 110-$n$, MOS switch 212 may be included in cross-connect switch circuitry 112 and amplifier 214 may correspond to amplifier 116-1, of FIG. 1. MOS switch 212 may be configured to couple photo detector 210 to amplifier 214, in response to control signal 220.

Figure 3:
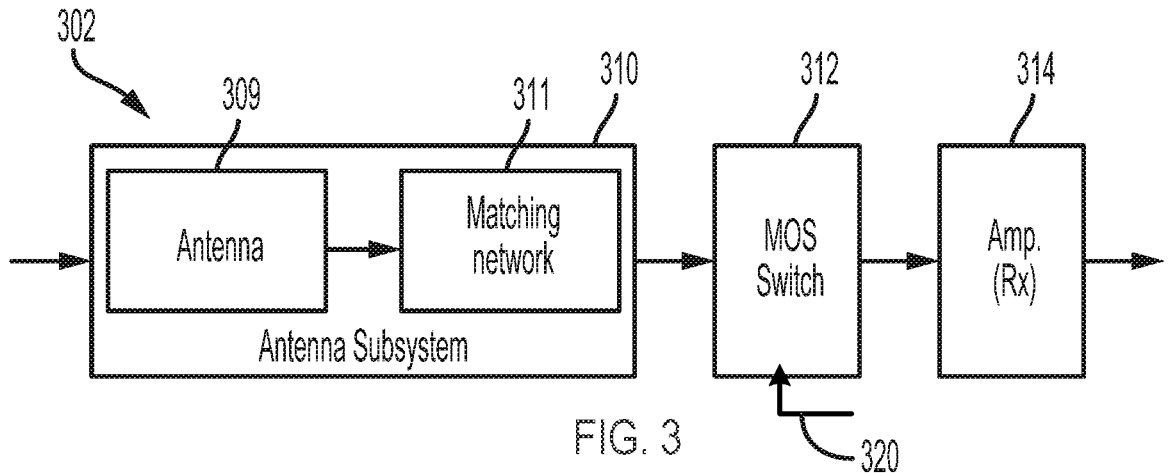
FIG. 3 illustrates a functional block diagram of one cross-point input/output path of another cross-connect switch device similar to cross-connect switch device of FIG. 1.

FIG. 3 illustrates a functional block diagram 302 of one cross-point path of another cross-connect switch device similar to cross-connect switch device 102 of FIG. 1. Cross-point path 302 includes an antenna subsystem 310, a MOS switch 312 and an amplifier 314. Antenna subsystem 310 includes an antenna 309 and a matching network 311. Antenna 309 may be configured to receive, for example mm (millimeter) electromagnetic waves or THz (Terahertz) electromagnetic waves. Antenna 309 may be tuned to a desired operating frequency in a spectral region of interest. Matching network 311 may be configured to at least partially impedance match antenna subsystem 310 and MOS switch 312. The impedance matching is configured to compensate for the equivalent parasitic capacitance of the MOS transistors. The impedance matching may be realized through the antenna design itself or with supplementary passive elements added before or after each MOS transistor. MOS switch 312 may be configured to couple antenna subsystem 310 to amplifier 314, in response to control signal 320.

Figure 4:
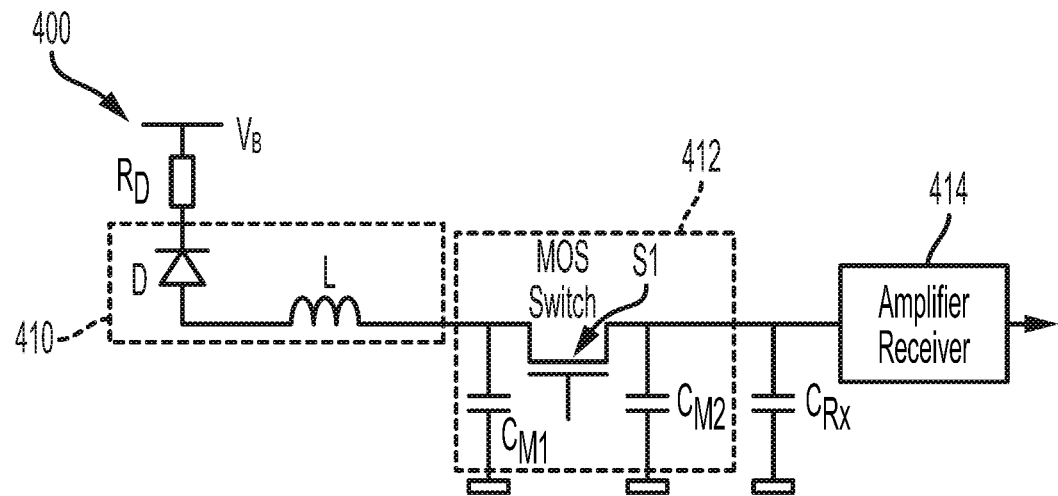
FIG. 4 illustrates a circuit diagram of one example cross-point circuit that includes an input/output path corresponding to the cross-point input/output path of FIG. 2.

FIG. 4 illustrates a circuit diagram of one example cross-point circuit 400 that includes an I/O path corresponding to the cross-point I/O path 202 of FIG. 2. Cross-point example circuit 400 includes a photo detector 410, a switch 412 and an amplifier-receiver circuitry 414. In this example, the photo detector 410 is an avalanche photo diode (APD) and the switch 412 corresponds to a MOS transistor. The amplifier-receiver circuitry 414 may correspond to an amplifier and/or an amplifier that is coupled to and/or included in a receiver.

Cross-point example circuit 400 further includes a resistance, $R_D$, and a capacitance $C_{Rx}$ corresponding to an input capacitance of amplifier-receiver circuitry 414. The resistance $R_D$ is coupled between the avalanche photodiode 410 and a bias voltage, $V_B$. The input capacitance, $C_{Rx}$, is coupled between the switch 412 and the amplifier-receiver 414.

APD 410 includes an ideal photodiode, D, and a series inductance, L. The series inductance L corresponds to an output impedance of avalanche photo diode 410. In other words, the output impedance ($Z_{out}$) of the APD 410 may be modeled as an equivalent inductive effect represented by inductance L. The inductance effect may compensate for at least some of the parasitic capacitances associated with the MOS transistors that may be present at the level of each APD. Such compensation may enable at least partial impedance matching and/or passive equalization, thus providing a relatively higher usable bandwidth and enhanced power-per-bit efficiency.

In one nonlimiting example, a silicon APD manufactured using a standard CMOS (complementary MOS) technology may exhibit a relatively low breakdown-voltage (for example, on the order of 10 Volts) and a bandwidth of greater than 1-GHz (gigahertz).

MOS transistor 412 includes an ideal MOS switch S1 and first and second parasitic capacitances $C_{M1}$, $C_{M2}$ associated with a drain and a source of the MOS transistor 412. The equivalent inductive effect of APD 410 may compensate for at least some of the parasitic capacitance of MOS transistor 412. Thus, the inductance, L, and parasitic capacitances may facilitate at least partial impedance matching and/or passive equalization. Such impedance matching and/or passive equalization may yield a relatively larger usable bandwidth and a power-per-bit efficiency enhancement for the cross-point circuit.

For example, with a 0.35 µm (micrometer) CMOS manufacturing process, an optimized analog equalization of APD 410 and switch 412 may achieve 1.8-Gb/s (gigabits per second) error-free optical wireless transmission employing a less than 40-MHz (megahertz) BW (bandwidth) PN PD (photo detector). In one example, optimized analog equalization may achieve about a 45 fold increase in bandwidth compared to a non-equalized system. Based on analog equalization and using a relatively more advanced integration technology (e.g., a less than or equal to 65-nm CMOS node and/or SiGe (silicon-germanium), it is contemplated that a 40-Gb/s data-rate from a greater than 1-GHz BW CMOS APD may be achievable. Such bandwidth-enhanced structures of APDs with inductance L modeling the inductive effect may be utilized to optimize the network-capacitance matching in a digitally-controlled load-variable environment, for example, an APD loaded by 1 to N receivers.

$R_D$, positioned between the APD and the bias voltage, may correspond to a degeneration-resistance. The impedance matching, LC-resonance tunability and/or programmability to different conditions (e.g., temperature, process, bias-voltage variations) may be controlled using either the bias voltage $V_B$ or resistance $R_D$. The number of switches and amplifier-receivers turned ON or OFF may be controlled using either the bias voltage $V_B$ or resistance $R_D$. In one nonlimiting example, the controlling may be an analog technique using parallel MOS-transistors and/or by controlling the bias voltage externally (tunability). In another nonlimiting example, the control may be digital (i.e., programmability) using a network of switched top parallel resistors or digitally set bias voltage levels. In some embodiments, combinations involving an analog-to-digital converter (ADC) or a digital-to-analog converter (DAC) may be used to support flexibility, improved tuning resolution and/or extended variation ranges. For example, an electrical subsystem with a 40-Gb/s bit-rate with less than 40-mW (milliwatt) DC-power may yield a power-efficiency per channel of less than 1 pJ (pico-Joule)/bit.

Figure 5:
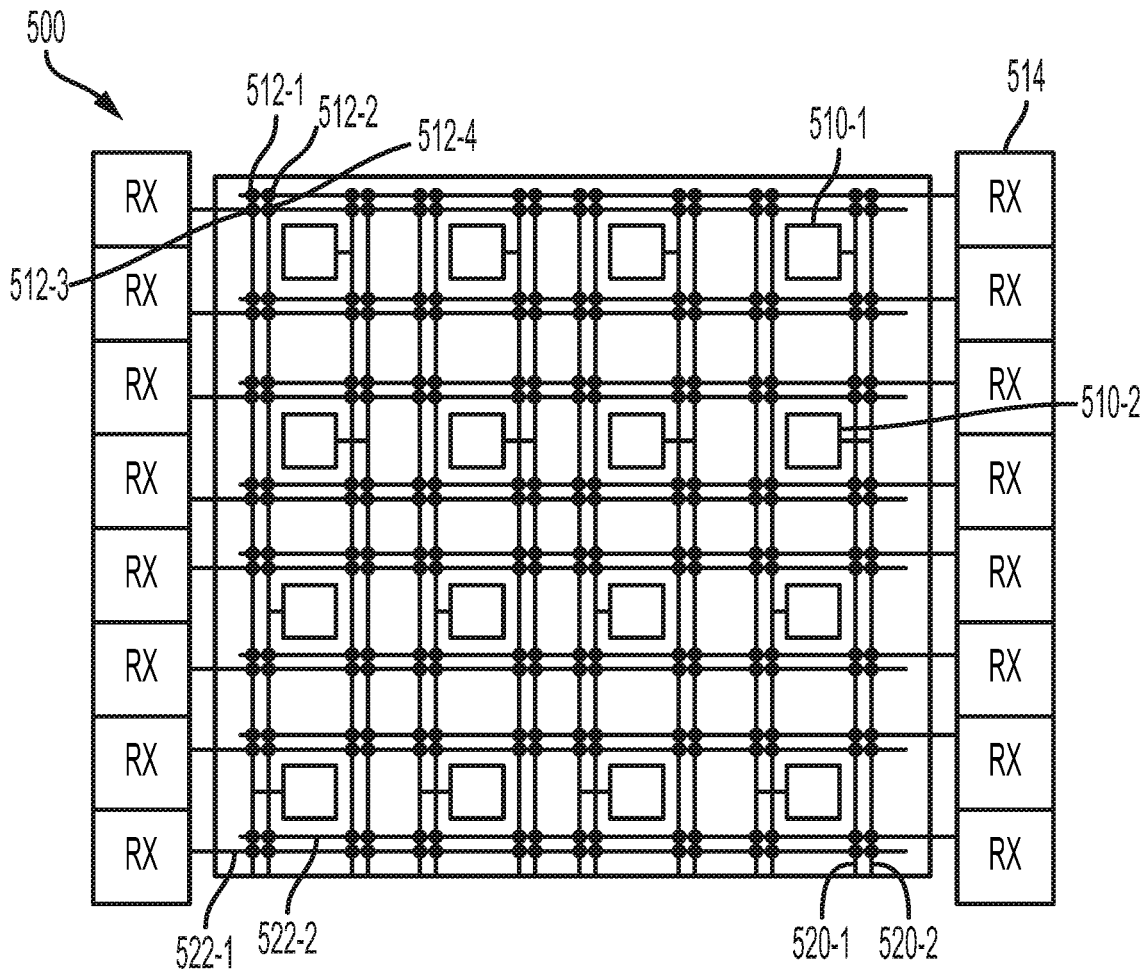
FIG. 5 illustrates one example cross-connect switch device, consistent with several embodiments of the present disclosure.

FIG. 5 illustrates one example cross-connect switch device 500. Cross-connect switch device 500 includes a plurality of transducers, e.g., transducers 510-1, 510-2, a plurality of switches, e.g., switches 512-1, 512-2, 512-3, 512-4, and a plurality of amplifier-receiver circuitries (Rx), e.g., Rx 514. In other words, in this example 500, the amplifiers are included in the receivers. However, this disclosure is not limited in this regard. In one embodiment, the transducers 510-1, 510-2 may be photo detectors. In another embodiment, the transducers 510-1, 510-2 may correspond to antennas or antenna subsystems that include antennas and a matching network, as described herein. In an embodiment, cross-connect switch device 500 may be included in an integrated circuit (IC).

Cross-connect switch device 500 is configured as an at least two-dimensional array architecture. In one example, the cross-connect architecture of cross-connect switch device 500 may be generally square, including N×N transducers. In another example, the cross-connect architecture 500 may be generally rectangular, including N×M transducers with N not equal to M. Example cross-connect switch device 500 includes 16 transducers arranged in a 4×4 array and two columns of eight amplifier-receivers each, however, this disclosure is not limited in this regard. For example, for a per channel bit rate of 40 gigabits per second (Gb/s), the 4×4 transducers provide 16-paths, then 16 paths×40 Gb/s per path corresponds to 640 Gb/s aggregate capacity.

The architecture of cross-connect switch device 500 is configured to minimize an amount of area occupied by cross-connect switch device 500. Cross-connect switch device 500 includes a plurality of columns (i.e., column conductors), e.g., columns 520-1, 520-2, and a plurality of rows (i.e., row conductors), e.g., rows 522-1, 522-2. The columns are configured to couple transducers and switches. Thus, each column may be connected to a respective transducer and at least one switch. The rows are configured to couple switches and amplifier-receivers. Thus, each row may be connected to a respective amplifier-receiver and at least one switch. The rows and columns of cross-connect switch device 500 are arranged in a cross-point architecture and each switch is positioned at or near a cross point of a column and a row. Activating a selected switch is configured to couple a target column and target row that cross at or near the switch. Thus, each switch is configured to couple a target transducer to a target amplifier-receiver when selected.

In an embodiment, cross-connect switch device 500 may be included in an integrated circuit (IC). The cross-connect switch device IC may then provide an increased bandwidth, DC power reduction and relatively fast channel-to-channel switching capability, a reduction in bill-of-materials (BoM) and form factor reduction. The form factor may then facilitate a relatively higher level rack integration with a relatively larger number of cross-connect switches in a given space. It is contemplated that a size and/or capacity of a cross-connect switch architecture, consistent with the present disclosure, may be increased by including relatively advanced jitter-cleaning and/or adaptive equalization functions.

Figure 6:
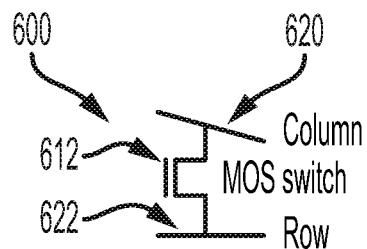
FIG. 6 illustrates is a circuit diagram of a cross-point included in, for example, cross-connect switch device of FIG. 5.

FIG. 6 illustrates is a circuit diagram of a cross-point 600 included in, for example, cross-connect switch device 500 of FIG. 5. Cross-point 600 includes a switch 612 coupled between a column conductor 620 and a row conductor 622. Column 620 and row 622 are configured to cross at or near switch 612. In one nonlimiting example, switch 612 may correspond to a MOS switch. Cross-point 600 illustrates the structure of cross-connect architecture 500 at or near each switch, e.g., switches 512-1, 512-2, 512-3, 512-4.

Figure 7:
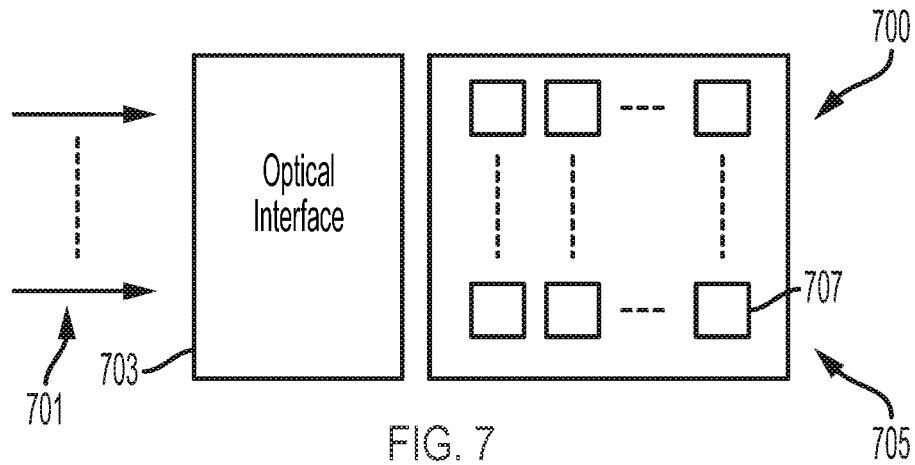
FIG. 7 illustrates an example optical system that includes an optical interface and a cross-connect switch device, consistent with the present disclosure.

FIG. 7 illustrates an example optical system 700 that includes an optical interface 703 and a cross-connect switch device 705, consistent with the present disclosure. The optical interface 703 is configured to receive a plurality (e.g., N×M) incoming optical signals 701 and to provide at least a representation of the received incoming signals to the cross-connect switch device 705. The cross-connect switch device 705 includes a plurality of transducers, e.g., transducer 707.

In one embodiment, optical interface 703 may be configured for imaging applications. In this embodiment, the optical interface 703 may correspond to one optical element. The single optical element may include, but is not limited to, a lens, a micro-lens, a reflector, micro-reflector, grating, interferometer, etc. The optical interface 703 may be fixed or movable and controlled by, for example, electrical, magnetic, electromagnetic, mechanical, heat, etc. The single optical element is configured to be used with the complete cross-connect switch device 705.

In another embodiment, optical interface 703 may be configured for non-imaging applications. In this embodiment, the optical interface 703 may include a plurality of optical elements. Each optical element may include, but is not limited to, a lens, a micro-lens, a reflector, micro-reflector, grating, interferometer, etc. The optical elements included in optical interface 703 may be fixed or individually movable and controlled by, for example, electrical, magnetic, electromagnetic, mechanical, heat, etc. The optical interface including the plurality of optical elements is configured to be used with the complete cross-connect switch device 705. In some embodiments, arrangements of optical interfaces leading to a reduced optical array size are possible. In this case, each optical interface may be configured to address a plurality of transducers of the cross-connect switch device 705.

Figure 8:
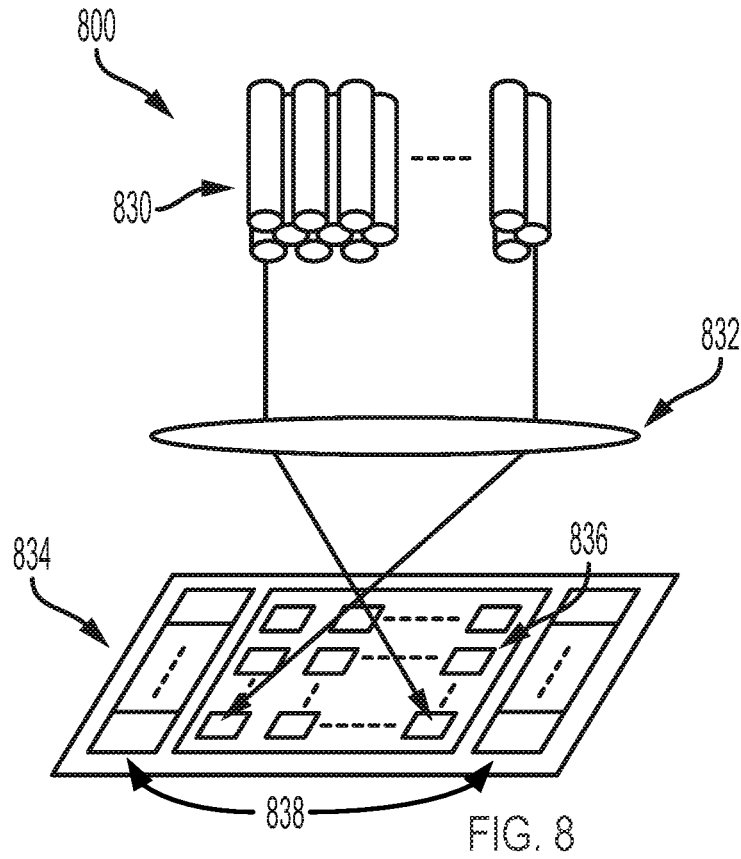
FIG. 8 is a sketch illustrating another example optical system, consistent with one embodiment of the present disclosure.

FIG. 8 is a sketch illustrating another example optical system 800, consistent with one embodiment of the present disclosure. The optical system 800 includes a plurality of bundles 830 of optical fibers that may each include a plurality of optical fibers. The optical system 800 further includes an optical interface 832 and a cross-connect switch device 834. In this example, the optical interface corresponds to an imaging lens. The cross-connect switch device 834 includes an array 836 of photo detectors, switches and column and row interconnects. The cross-connect switch device 834 further includes arrays of amplifier-receivers 838. In one nonlimiting example, optical system 800 may be configured for a direct fiber-data application. Optical energy delivered via the bundles 830 of optical fibers may be focused and/or refracted by imaging lens 832 onto the photo detectors included in cross-connect switch device 834.

It is contemplated that the optical interface may include, but is not limited to, non-imaging lensing or reflection configurations based on an array of lenses, micro-lenses, mirrors or micro-mirrors placed individually on top of each photo detector or detection-cell or by clusters. The optical interface may be configured to utilize optical devices in fixed, steerable and/or controllable modes. Control may be provided by control techniques including, but not limited to, electrical, magnetic, electromagnetic, mechanical, heat, etc.

In one nonlimiting example, optical system 800 may correspond to a direct data-signal application from the optical fiber bundles 830 through the imaging lens 832 onto the cross-connect switch device 834. An optical input signal may be a 850 nm near infrared (NIR) signal or may have wavelength in a visible spectrum range and may then support silicon photodetector responsivity. A relatively large aggregate capacity increase per volume or area unit compared to a purely optical or electrical switching approach may then be achieved.

Figure 9:
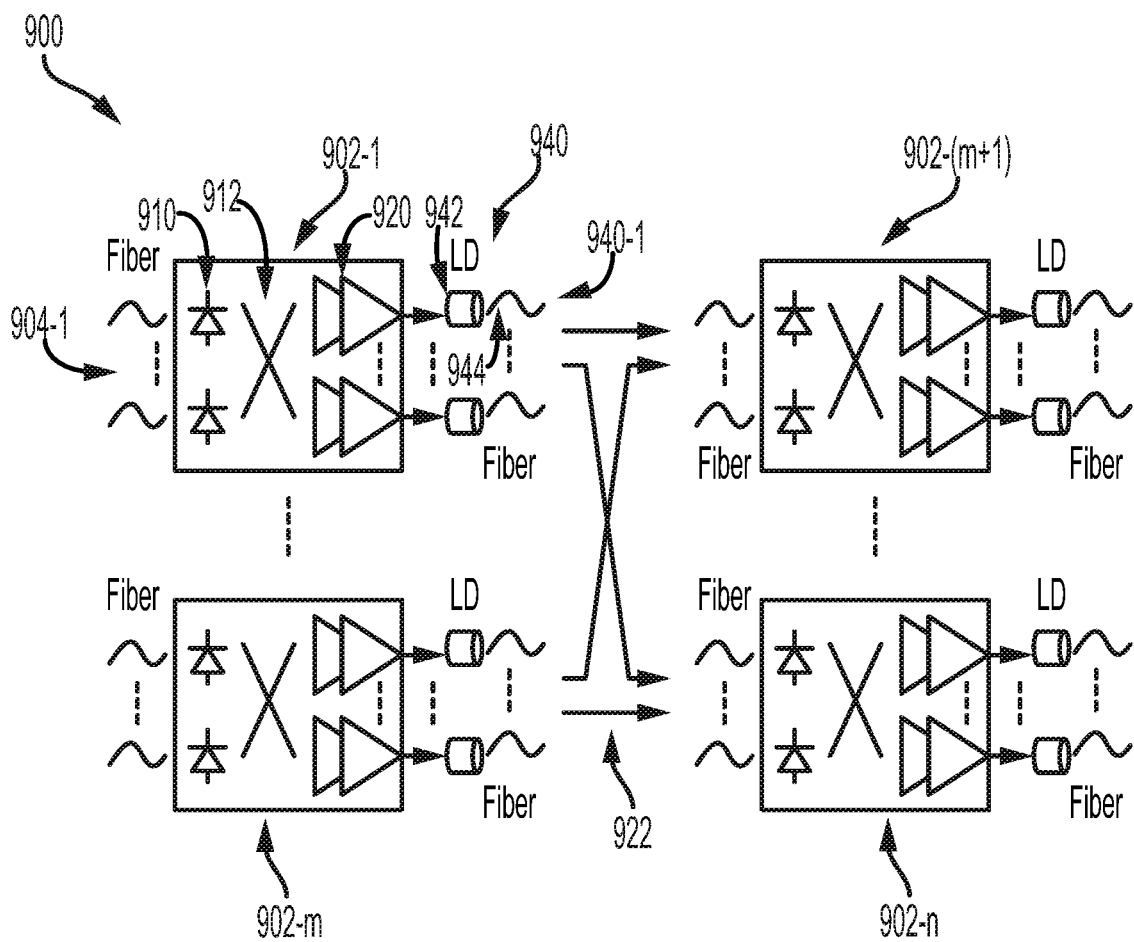
FIG. 9 is a sketch illustrating another example optical system, consistent with one embodiment of the present disclosure.

FIG. 9 is a sketch illustrating another example optical system 900. Optical system 900 includes a plurality of cross-connect switch devices 902-1, . . . , **902-*m*, 902-(*m*+1), . . . , 902-*n* and an optical cross-connect 922. Optical cross-connect 922 is configured to couple one or more input cross-connect switch devices 902-1, . . . , 902-*m* to one or more output cross-connect switch devices 902-(*m*+1), . . . , 902-*n***.

Each cross-connect switch device, e.g., cross-connect switch device 902-1, is configured to receive input optical energy from a plurality 904-1 of optical fibers and to provide an optical output to one or more of a plurality 940 of laser diode output subsystems. Each laser diode output subsystem, e.g., laser diode output subsystem 940-1, includes a laser diode 942 coupled to an output optical fiber 944. Each cross-connect switch device, e.g., cross-connect switch device 902-1, includes a plurality 910 of photo detectors, a cross-point switch array 912 and a plurality 920 of integrated laser diode drivers. The photo detectors 910, switch array 912 and laser diode drivers 920 are configured similar to the cross-connect switch device 102 of FIG. 1, with the amplifier-receivers replaced with the laser diode drivers 920.

Thus, optical system 900 may correspond to an upper level fiber networked cross-connect optical electrical optical (OEO) architecture. The laser-diode (LD) driver arrays may be integrated as the output stage of the cross-connect switch device and may include appropriate signal quality-enhancement functions (equalization, pre-emphasis, etc.) to adapt for different load types and long fiber interconnects. Integrated jitter-cleaning, clock-recovery functions and multiplexer/demultiplexer architectural flexibility challenges may be managed.

Thus, a cross-connect switch architecture, consistent with the present disclosure, may be reconfigured as a joint switch-transceiver solution with the inclusion of the laser-driver array. The reconfigured architecture may then enable design and fabrication of an increased-capacity router, allowing remote rack connections for enhanced data-traffic management flexibility.

A cross-connect switch architecture consistent with the present disclosure is configured to be relatively low power with relatively low signal losses while providing relatively fast channel-to-channel switching and a reduced form factor. For example, a passive MOS switch array positioned between a photo detector array and an amplifier-receiver array may provide a relatively compact switch architecture with minimized buffering needs and lower interconnect parasitic losses, resulting in a lower DC power consumption and higher bandwidth (BW) per channel. Thus, a cross-connect switch architecture consistent with the present disclosure may be configured to provide benefits associated with both optical switching (e.g., low power consumption and low signal losses) and electrical switching (small form factor (integrated circuit) and relatively fast channel-to-channel switching).

What is claimed is:

1. A cross-connect switch device comprising:
    a cross-point switch array;
    a plurality of photo detectors; and
    a plurality of amplifiers, each cross-point switch array comprising a plurality of switches, each switch coupled between a respective photo detector and a respective amplifier and configured to couple the respective photo detector to the respective amplifier when the switch is selected;
    wherein the photo detectors are avalanche photo diodes and the switches are metal oxide semiconductor (MOS) transistors; and
    wherein a photo diode inductance at least partially impedance matches a parasitic capacitance of a MOS transistor coupled to the photo diode.

2. The device of claim 1, wherein each photo diode is coupled to a bias voltage supply via a respective degeneration resistance.

3. The device of claim 1, wherein the amplifiers are transimpedance amplifiers.

4. The device of claim 1, wherein each amplifier is at least one of included in and/or coupled to a respective receiver configured to receive an electrical representation of an input optical signal.

5. The device of claim 1, wherein each switch is coupled between a column conductor and a row conductor, the column conductor coupled to a photo detector and the row conductor coupled to an amplifier.

6. The device of claim 1, wherein the cross-point switch array, the photo detectors and the amplifiers are included in an integrated circuit.

7. An optical system comprising:
    an optical interface configured to receive an optical signal; and
    a cross-connect switch device comprising a cross-point switch array, a plurality of photo detectors, and a plurality of amplifiers, each cross-point switch array comprising a plurality of switches, each switch coupled between a respective photo detector and a respective amplifier and configured to couple the respective photo detector to the respective amplifier when the switch is selected;
    wherein the photo detectors are avalanche photo diodes and the switches are metal oxide semiconductor (MOS) transistors; and
    wherein a photo diode inductance at least partially impedance matches a parasitic capacitance of a MOS transistor coupled to the photo diode.

8. The optical system of claim 7, wherein each photo diode is coupled to a bias voltage supply via a respective degeneration resistance.

9. The optical system of claim 7, wherein the amplifiers are transimpedance amplifiers.

10. The optical system of claim 7, wherein each amplifier is at least one of included in and/or coupled to a respective receiver configured to receive an electrical representation of an input optical signal.

11. The optical system of claim 7, wherein each switch is coupled between a column conductor and a row conductor, the column conductor coupled to a photo detector and the row conductor coupled to an amplifier.

12. The optical system of claim 7, wherein the cross-point switch array, the photo detectors and the amplifiers are included in an integrated circuit.

13. The optical system of claim 7, wherein the optical interface is an imaging optical interface comprising one optical element.

14. The optical system of claim 7, wherein the optical interface comprises a plurality of optical elements.

\* \* \* \* \*